United States Patent [19]

Chu

[11] 4,313,150
[45] Jan. 26, 1982

[54] LATCHING LEVER FOR PRINTED CIRCUIT BOARDS

[75] Inventor: Pak-Jong Chu, Ottawa, Canada

[73] Assignee: Northern Telecom Limited, Montreal, Canada

[21] Appl. No.: 78,016

[22] Filed: Sep. 24, 1979

[51] Int. Cl.³ .............................................. H05K 1/18
[52] U.S. Cl. ................................... 361/399; 361/415
[58] Field of Search ...................... 361/391, 399, 415; 339/45 M

[56] References Cited

U.S. PATENT DOCUMENTS

| | | | |
|---|---|---|---|
| T876,004 | 7/1970 | Andreini | 339/45 M |
| 3,767,974 | 10/1973 | Donovan | 361/391 X |
| 3,952,232 | 4/1976 | Coules | 361/415 |
| 4,064,551 | 12/1977 | Lightfoot | 361/399 |
| 4,070,081 | 1/1978 | Takahasi | 361/399 X |
| 4,197,572 | 4/1980 | Aimar | 361/399 |
| 4,233,646 | 11/1980 | Leung | 361/399 |

FOREIGN PATENT DOCUMENTS 135437  5/1979  German Democratic Rep. .................................... 361/415

OTHER PUBLICATIONS

Calmark Corp., Cat. C7/376, p. 15, Mar. 1976 by Calmark Corp., San Gabriel Calif. 91776.

*Primary Examiner*—Richard R. Kucia
*Attorney, Agent, or Firm*—Stuart L. Wilkinson

[57] ABSTRACT

A latching lever for aiding insertion, retention and removal of PCB's is pivoted on a PCB and has an operating handle, a pair of arms which straddle the PCB and latch the PCB within the frame when fully inserted, and a camming piece which pivotably engages the frame to permit the PCB to be levered into and out of the frame. An effective, simple latch mechanism is provided by domed pips on the legs which engage in a hole through the PCB.

8 Claims, 8 Drawing Figures

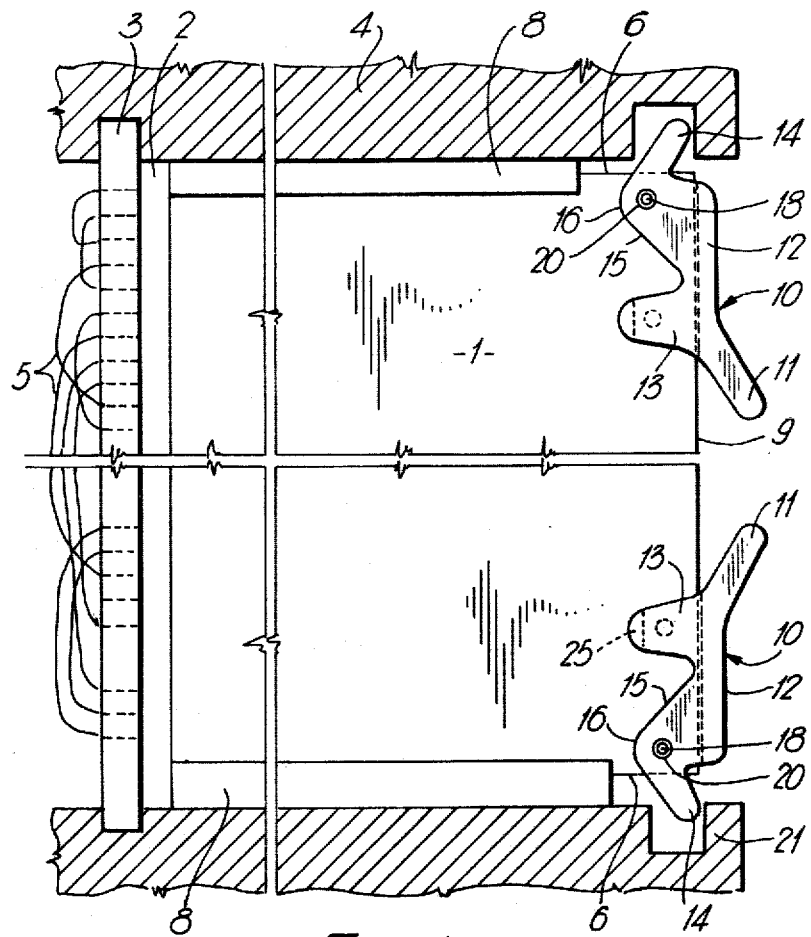
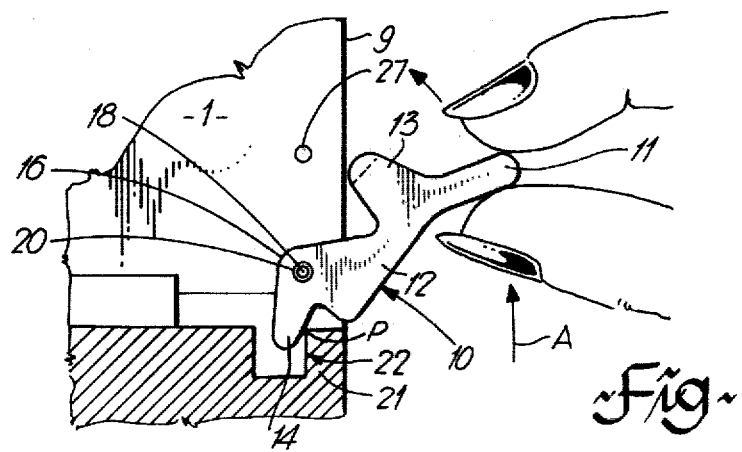

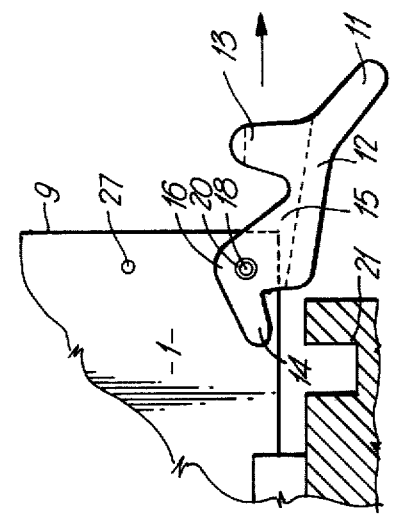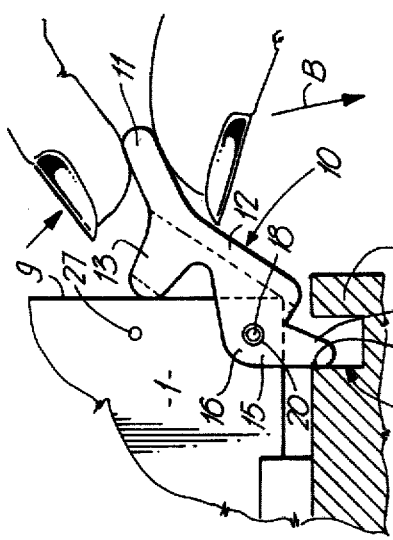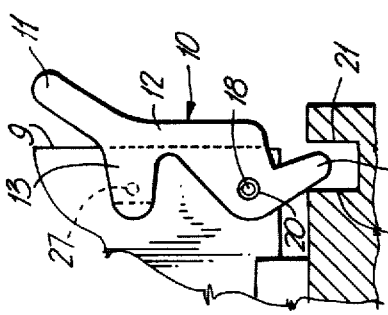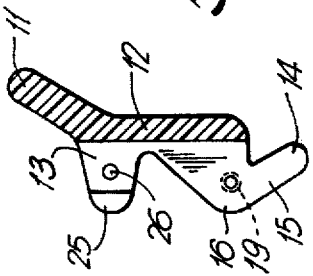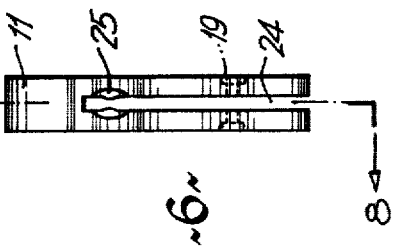

LATCHING LEVER FOR PRINTED CIRCUIT BOARDS

This invention relates to a latching lever for use in aiding insertion, retention, and removal of printed circuit boards (PCB's) relative to a mounting frame.

Typically in a small cabinet housing the PCB's of a PABX (private automatic branch exchange) a cabinet frame has a group of top and bottom guide channels within which individual circuit boards can slide into and out of the cabinet. Mounted on the rear edge of each board is a connector module incorporating a number of pins which mate with corresponding sockets of a connector module mounted at the rear of the cabinet. Electrical connection between circuit board components and power supply, jumper wires, etc., is obtained by mating the modules.

Since many pin-socket connections must be simultaneously made on inserting a PCB each pin-socket engagement must be resilient to allow for pins that are mis-aligned, or out of position, or both. Consequently the force necessary to insert or to remove a particular PCB might range from 8 to 26 pounds. In the ensuing disclosure, the terms "insertion" and "removal" of a PCB refer to that part of PCB movement which results in the connector modules being mated or unmated. The terms do not denote additional, unfettered sliding movement of the PCB's within the guide channels. To assist the insertion and removal of a PCB, the front edge of the PCB may support two lever devices—one near the top, one near the bottom.

In U.S. Pat. No. 4,064,551 (Lightfoot), a face plate is secured to the front edge of a PCB. A pair of lever devices are mounted on the face plate, and the PCB. The PCB being forced out by levering the face plate away from the frame. If close packing of PCB's is paramount, it would seen appropriate to mount the levers directly to the PCB's so obviating the face plate. Such a design is disclosed in U.S. Pat. No. 3,952,232 (Coules). The device disclosed uses a lever action to assist only PCB removal. To insert a PCB lock the lever device is merely pivoted to a press-fit position, seats against the PCB front edge and presents a broad surface adapted to application of thumb pressure. The lever device straddles the PCB front edge, having a pair of flanges extending adjacent respective PCB's. From one flange, an integral pin projects into a hole in the PCB to establish pivotal engagement. From the other flange, an integral spacer bears against the other surface of the PCB to retain the pin within the PCB. Where the lever action utilized for both PCB removal and insertion, the broad surface would be unnecessary, the lever device could be narrower, and consequently an even greater packing density could be achieved. One problem with this is that the required insertion force if greatly exceeded may cause damage to the PCB or to the connector modules.

The invention proposes a latching lever for aiding insertion and removal of a PCB relative to a mounting frame, the lever being a simple one-piece plastics molding which, in combination with an apertured PCB provides a resilient latching mechanism. When the PCB is inserted to a position in which its associated connector module is mated with a corresponding connector module, the lever latches thereby providing an indication that the PCB is in place. Moreover, the latch needs to be positively released before the lever can be operated to remove the PCB, so inadvertent PCB removal is rendered less likely.

According to the invention there is provided a latching lever for aiding insertion and removal of a printed circuit board (PCB) relative to a mounting frame, the device comprising a one-piece plastics molding having a back part from which extends an integral slotted section, the slotted section having a mounting part incorporating pivot means for mounting the PCB within the slot, the slotted section further having a camming part for pivotally engaging the frame to function as a lever pivot with lever load being at the PCB mounting, pivotal axes being parallel, the lever, in use, being pivotal in one direction to a first position to lever the PCB into an inserted position and being pivotal in the opposite direction to a second position to lever the PCB to a removed position, the slotted section further having a latching part having opposed projections on surfaces defining the slot, the projections being snap-locatable within an aperture in the PCB to resiliently latch the lever when the PCB is fully inserted into the mounting frame.

An embodiment of the invention will now be described by way of example with reference to the accompanying drawings, in which:

FIG. 1 shows a pair of latching levers mounted on a PCB inserted into a mounting frame;

FIGS. 2 to 5 show the lower lever of FIG. 1 respectively during phases of insertion and removal of a PCB;

FIGS. 6 and 7 are side and end elevations of the lever of FIG. 1;

FIG. 8 is a sectional view on the line VIII—VIII of FIG. 6.

Referring in detail to the drawings FIG. 1 shows a printed circuit board (PCB) 1. Mounted along a rear edge of the PCB is an elongate socket module 2 in which are housed sockets which are electrically connected to components and networks of the PCB circuit. The socket module 2 mates with a corresponding pin array 3 stacked on a back plane which is mounted on a frame 4. Electrically connected to individual pins are jumper and interconnect leads 5 which extend from the back plane rear face. The PCB top and bottom edges 6 slide freely on a pair of channel section guides 8 which, together with laterally extending top and bottom rails 21, form part of the frame 4.

Mounted on a front edge 9 of the PCB near both its top and bottom corners are latching levers 10 which are used to aid both insertion and removal of the PCB to which they are attached. The levers 10 assist in overcoming the insertion and removal forces necessary respectively to mate and to disconnect pin and socket modules 2 and 3. Basically these forces are present because individual sockets have a gripping action to ensure good electrical contact between pin and socket. In addition, in large arrays of pins and sockets, some of each are liable to be slightly out of position or somewhat misaligned. Consequently the pins and sockets are designed to yield resiliently as connection is made and this contributes to the insertion and removal forces.

Each latching lever 10 has as shown in plan view in FIGS. 1 to 6 essentially the aspect of a person "on all fours"—i.e. a kneeling position with both hands touching the ground. To continue the analogy, each lever has a head-piece or handle 11, a back 12, two arms 13, a foot piece 14 and two legs 15, the legs being bent at a knee portion 16. The legs 15, arms 13 and foot piece 14 form a slotted section as shown in FIGS. 7 and 8, the slot 24 being sufficiently wide to receive the edge of the PCB 1.

The handle 11 is thin, plate-like and inclined to the back 12 so that its outer end is spaced from the PCB front edge 9. In use, the handles 11 are gripped between thumb and forefinger, the top lever 10 being manipulated by one hand and the bottom lever 10 by the other. The longitudinal axis of the handle 11 is aligned with a pivotal mounting 18 between the lever 10 and the PCB so that pressure applied perpendicularly to the plane of the handle in order to insert the PCB (FIG. 2—arrow A) or to remove it (FIG. 4—arrow B) is translated into a turning moment.

The mounting 18 is formed at aligned holes through the knee portions 16 and the PCB 1. The holes in the legs have recessed margins 19 which accommodate the ends of a rivet 20 used to hold the PCB 1 and the lever 10 together.

In use, each of the latching devices acts as a second-order lever, force being applied at the handle 11 and the load being at the mounting 18. The lever pivot is located at a point P of interengagement between the footpiece or camming lobe 14 and the rail 21. The position of the point P depends upon whether the PCB is being inserted, in which case point P is at the outer edge 22 of the rail 21 (FIG. 2) or removed, in which case point P is at the inner edge 23 of the rail 21 (FIG. 4). The PCB is levered into the fully inserted position (pin and socket modules mating), by applying an anticlockwise moment to the lower lever 10 and a clockwise moment to the upper lever 10. As the lever is moved from a withdrawn position (FIG. 5) through the intermediate position (FIG. 2) to a fully inserted position (FIG. 3), the arms 13 move to straddle the PCB front edge 9. To facilitate entry of the PCB 1 into slot 24 between the two arms 13, outer ends of the arms are bevelled 25.

The inner surfaces of the arms are each formed with a domed pip 26. The two pips 26 oppose one another and are so located as to snap fit into a hole 27 in the PCB when the lever 10 is rotated fully to the inserted position shown in FIG. 3. In this way, the lever is latched. Consequently a positive releasing action is required before the PCB 1 can be levered from the frame 4 thus reducing the chance of a PCB becoming inadvertently unplugged. Latching has an additional benefit in that it should prevent application of excessive force to the PCB which might damage either the PCB itself or the plug and socket modules 2 and 3. Thus, a technician inserting the card would know that as soon as the snap-action is felt, pressure on the handle 11 must be released.

The PCB is removed by applying a clockwise moment to the lower lever and an anticlockwise moment to the upper lever. The board is levered into the removed position (pin and socket modules detached) whereupon by rotating the lever 10 a few degrees further (FIG. 5), the PCB can be freely withdrawn from the frame 4 by sliding it along the guides 8.

The particlar combination of opposed pips snap-locating into an aperture in the PCB is considered particularly advantageous since the one-piece plastics lever moulding is an extremely simple shape of uniform thickness. Furthermore, only a drilling operation is required in order to adapt the PCB for use in the latching mechanism.

What is claimed is:

1. In combination, a support frame, a rectangular circuit card, and a pair of latching levers, the circuit card having opposite side edges slidably engaging a first pair of vertically spaced rails extending horizontally into the frame, the circuit card having a rear edge supporting first connection means adapted for electrical interconnection with vertically arranged second connection means supported at the rear of the frame, the frame further including a pair of horizontally-extending U section rails extending perpendicularly to the first pair of rails and mounted at the front of the frame, the latching levers rotatably mounted adjacent opposite front corners of the circuit card, each lever engageable with a respective one of the U section rails, and comprising a one-piece plastic molding having a U section base part including a spine from which extend a pair of walls, first facing portions of the walls having means for rotatably mounting the circuit card therebetween, second facing portions of the walls having facing projections snap locatable within an aperture in the circuit card to resiliently latch the lever when the card is fully inserted into the frame, and a camming part consisting of extensions of the walls at one end of the base part, said camming part tapering away from the circuit card mounting point, the camming part pivotally engageable within a respective one of the U section rails to function as a lever pivot with lever load being at the circuit card mounting point, the camming part engageable with one inside surface of the U section rail to establish a first pivotal engagement about which the lever is pivoted to overcome an electrical contact insertion force, and engageable with an oppositely facing inner surface of the U section rail to establish a second pivotal engagement about which the lever is pivoted to overcome an electrical contact extraction force, and a handle integral with an angularly inclined relative to the spine on the far side thereof from the walls.

2. A combination as claimed in claim 1, in which the means for rotatably mounting the circuit card comprises aligned apertures through the walls, the apertures each having recessed margins at outer surfaces of the walls for accommodating the end of a rivet.

3. A combination as claimed in claim 1, in which the second wall portions are on the far side of the circuit card mounting from said camming part.

4. A latching lever as claimed in claim 1, in which the handle and the base part are generally planar and are inclined to one another at an angle of between 150 and 120 degrees.

5. A combination as claimed in claim 1, in which outer extremities of the second wall portions are bevelled to facilitate entry of the circuit card between the walls.

6. A combination as claimed in claim 1, in which the projections are domed pips.

7. A combination as claimed in claim 1, each of the levers being symmetrical about a central plane between the walls thereof.

8. A combination as claimed in claim 1, in which the second wall portions extend from a junction region between the handle and the spine.

* * * * *